US006963238B2

(12) United States Patent
Mochizuki

(10) Patent No.: US 6,963,238 B2
(45) Date of Patent: Nov. 8, 2005

(54) LEVEL SHIFT CIRCUIT

(75) Inventor: Kouji Mochizuki, Tokyo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/849,200

(22) Filed: May 20, 2004

(65) Prior Publication Data

US 2004/0232970 A1 Nov. 25, 2004

(30) Foreign Application Priority Data

May 20, 2003 (JP) ............... P.2003-142160

(51) Int. Cl.[7] .................................. H03L 5/00
(52) U.S. Cl. ............................ 327/333; 327/334
(58) Field of Search ........................ 327/331, 333, 327/334, 539, 540; 323/313, 315

(56) References Cited

U.S. PATENT DOCUMENTS

| | | | | |
|---|---|---|---|---|
| 3,530,395 A | * | 9/1970 | Prusha | 330/69 |
| 3,851,259 A | * | 11/1974 | Porawski | 327/334 |
| 3,980,966 A | * | 9/1976 | Gieck et al. | 330/69 |
| 4,105,975 A | | 8/1978 | Sanders et al. | |
| 5,283,580 A | | 2/1994 | Brooks et al. | |
| 5,481,217 A | * | 1/1996 | Nguyen | 327/333 |
| 5,557,238 A | | 9/1996 | Weiss | |
| 5,867,056 A | * | 2/1999 | Zoellick | 327/541 |
| 5,929,621 A | * | 7/1999 | Angelici et al. | 323/313 |
| 5,936,391 A | * | 8/1999 | Larsen et al. | 323/313 |
| 6,259,300 B1 | * | 7/2001 | Yasuda et al. | 327/333 |
| 6,268,817 B1 | | 7/2001 | Min et al. | |
| 6,853,174 B1 | * | 2/2005 | Inn | 323/285 |
| 2002/0113626 A1 | * | 8/2002 | Felder | 327/77 |

FOREIGN PATENT DOCUMENTS

JP 09-238078 9/1997

* cited by examiner

*Primary Examiner*—Terry D. Cunningham
(74) *Attorney, Agent, or Firm*—McDermott Will & Emery LLP

(57) ABSTRACT

A high-precision and high-performance level shift circuit, which is not adversely influenced by an offset error owned by an operational amplifier. Two sets of resistors (4o) and (4p) having the same resistance values, which are connected between differential output terminals and an operational amplifier (4r) for performing a level shift control are provided. A feedback operation is carried out in such a manner that an average voltage of each of differential outputs (4i) and (4m) is continuously made coincident with a DC reference potential (4q) irrespective of an offset error of an output-purpose operational amplifier, and a level shift function having a small error is realized. Two resistors (4h and 4l) are series-connected between a differential output of a digital/analog converter (4a) and a level shift circuit to output a voltage outside an output dynamic range of the digital/analog converter (4a).

4 Claims, 5 Drawing Sheets ically applied to such an analog interface circuit which has been manufactured in a semiconductor integrated circuit, for instance, a technique which is effectively utilized in a communication appliance known as a modulator, a speech codec, and the like.

2. Description of the Related Art

For instance, as shown in FIG. 3, at page 6 of Japanese Laid-open Patent Application No. Hei-9-238078, while a conventional level shift circuit is equipped with a differential operational amplifier and a single-phase operational amplifier, both a positive-phase output and a negative-phase output of a current adding type digital-to-analog converter are connected to two input terminals of the differential operational amplifier, respectively. Also, since a potential difference between the two input terminals of the differential operational amplifier is amplified by the single-phase operational amplifier and then the amplified potential difference is fed back to the current adding type digital-to-analog converter, output currents of the positive-phase output and the negative-phase output of the current adding type digital-to-analog converter are adjusted in a fine mode, offset voltages of a first output terminal and a second output terminal of the differential operational amplifier are adjusted in a fine mode, and thus, an offset error is decreased.

However, in the circuit arrangement described in the conventional technique, such a means for detecting and correcting the offset error which is owned by the differential operational amplifier itself is not provided, the offset error is increased. The present invention has been made to solve the above-described problem, and therefore, has an object to provide a level shift circuit capable of correcting an offset error of an entire system, which also contains an offset error owned by an operational amplifier itself.

SUMMARY OF THE INVENTION

To solve this problem, a level shift voltage output device, according to the present invention, is comprised of: resistors having two equal resistance values, which are used to continuously detect a neutral point voltage between two differential signal outputs by an operational amplifier; and an operational amplifier which amplifies a potential difference between this neutral point voltage and a third input voltage, and feeds back the amplified potential difference to either an input signal or a positive-phase input terminal of the operational amplifier.

DESCRIPTION OF THE PREFERRED EMBODIMENTS

Figure 1:
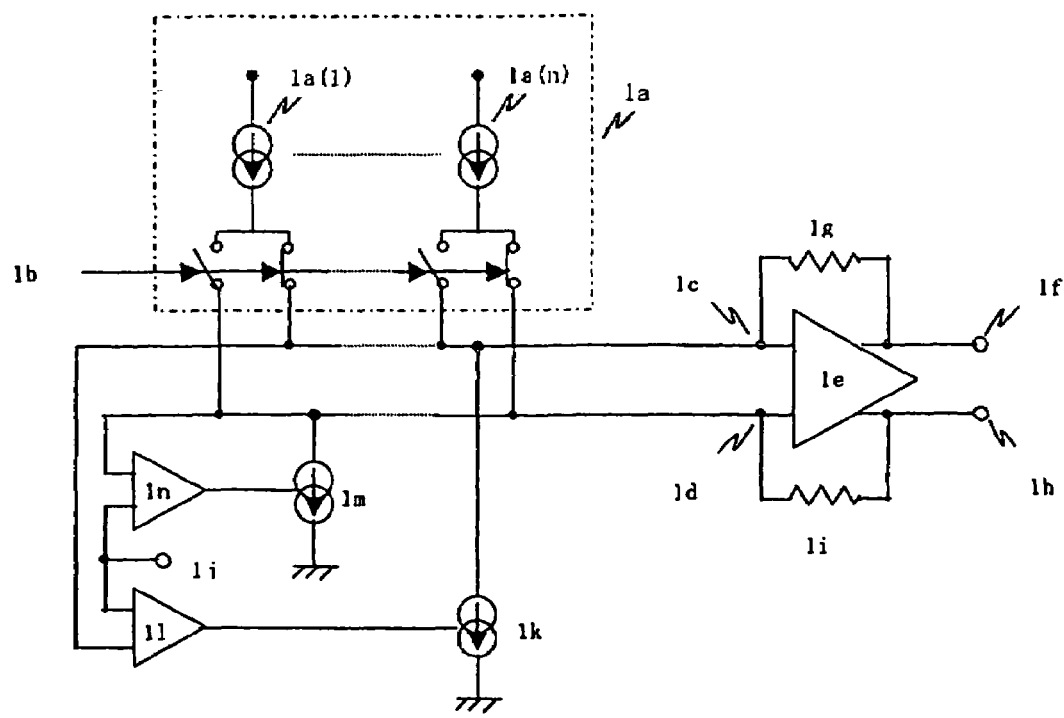
FIG. 1 is an electric wiring diagram for showing a level shift circuit which may be realized by the conventional technique.

FIG. 1 is an electric wiring circuit diagram for indicating a level shift circuit which may be realized by the conventional technique. The circuit shown in FIG. 1 is provided with a current adding type digital-to-analog converter $1a$, a first operational amplifier $1e$, a first resistor $1g$, a second resistor $1i$, a second operational amplifier $1l$, and also, a third operational amplifier $1n$. The current adding type digital/analog converter $1a$ is constituted by "n" pieces of current sources $1a(1)$ to $1a(n)$ which are weighted respectively every bits, and a plurality of switches, any one of which is turned ON in response to an n-bit digital input value $1b$, and this current adding type, digital/analog converter $1a$ owns both a positive-phase output $1c$ and a negative-phase output $1d$. The first operational amplifier $1e$ owns a differential output, and two input terminals thereof are connected to the positive-phase output $1c$ and the negative-phase output $1d$. The first resistor $1g$ is connected between a first output $1f$ of the first operational amplifier $1e$ and the positive-phase output $1c$. The second resistor $1i$ is connected between a second output $1h$ of the first operational amplifier $1e$ and the negative-phase output $1d$. The second-operational amplifier $1l$ amplifies a difference between the positive-phase output $1c$ and a DC reference potential $1j$, and then, feeds back this amplified difference potential to a first correcting current source $1k$. The third operational amplifier $1n$ amplifies a difference between the negative-phase output $1d$ and the DC reference potential $1j$, and then feeds back this amplified difference potential to a second correction current source $1m$.

In the current adding type digital/analog (D/A) converter $1a$, since an output of this D/A converter $1a$ is obtained as a current value, each potential of the positive-phase output $1c$ and the negative-phase output $1d$ may take an arbitrary voltage value.

Using a feedback operation, the first operational amplifier $1e$ changes the potential of the first output $1f$ into such a potential which is defined by subtracting a voltage drop appeared across the first resistor $1g$ from the potential of the positive-phase output $1c$. Also, the first operational amplifier $1e$ changes the potential of the second output $1h$ into such a potential which is defined by subtracting a voltage drop appeared across the second resistor $1i$ from the potential of the negative-phase output $1d$. Further, the second operational amplifier $1l$ controls the first correcting current source $1k$ in such a manner that the potential of the positive-phase output $1c$ becomes equal to the DC reference potential $1j$, and the third operational amplifier in controls the second correcting current source $1m$ in such a manner that the potential of the negative-phase output $1d$ becomes equal to the DC reference potential $1j$.

As a result of these operations; since both the potential of the positive-phase output $1c$ and the potential of the negative-phase output $1d$ become equal to the DC reference potential $1j$, both the potential of the first output $1f$ and the potential of the second output $1h$ may constitute a differential output respectively, while the DC reference potential $1j$ is defined as a maximum voltage.

As previously explained, in the circuit shown in FIG. 1, the circuit elements indicated by "1e" to "1n" may function as the level shift circuit with respect to both the positive-phase output 1c and the negative-phase output 1d of the current adding type D/A converter 1a.

However, in the above-described circuit arrangement, there is no such a means for detecting an offset error owned by the first operational amplifier 1e itself and for correcting this detected offset error. As a result, the offset error owned by the first operational amplifier 1e itself is added to both the first output 1f and the second output 1h, so that this level shift circuit cannot be manufactured in high precision.

To solve this problem, such a means is required by which offset errors are detected and corrected with respect to the first output 1f and the second output 1h.

Figure 2:
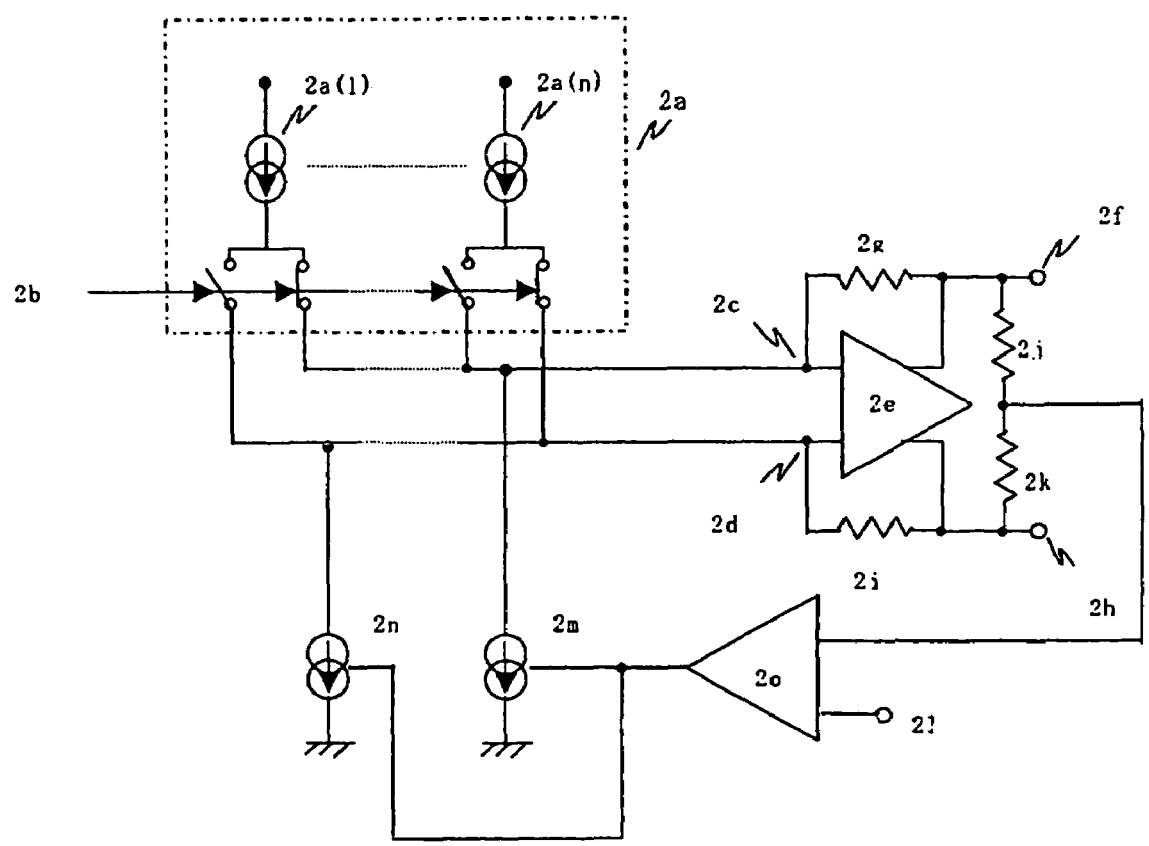
FIG. 2 is an electric wiring diagram for indicating a level shift circuit according to an embodiment 1 of the present invention.

FIG. 2 shows an embodiment 1 of a level shift circuit recited in claim 1 of the present invention.

The circuit indicated in FIG. 2 is equipped with a current adding type digital-to-analog converter 2a, a first operational amplifier 2e, a first resistor 2g, a second resistor 2i, a third resistor 2j, a fourth resistor 2k, and a second operational amplifier 2o. The current adding type digital/analog converter 2a is constituted by "n" pieces of current sources 2a(1) to 2a(n) which are weighted respectively every bit, and a plurality of switches, any one of which is turned ON in response to an n-bit digital input value 2b, and this current adding type digital/analog converter 2a owns both a positive-phase output 2c and a negative-phase output 2d. The first operational amplifier 2e owns a differential output, and two input terminals thereof are connected to the positive-phase output 2c and the negative-phase output 2d. The first resistor 2g is connected between a first output 2f of the first operational amplifier 2e and the positive-phase output 2c. The second resistor 2i is connected between a second output 2h of the first operational amplifier 2e and the negative-phase output 2d. The third resistor 2j and the fourth resistor 2k are series-connected between the first output 2f and the second output 2h, and a resistance value of the third resistor 2j is equal to that of the fourth resistor 2k. The second operational amplifier 2o amplifies a difference between a DC reference potential 21 and a potential of a center point between the first output 2f and the second output 2h, which is produced at a connection point between the third resistor 2j and the fourth resistor 2k. Then, the second operational amplifier 2o feeds back the amplified potential difference to both a first correcting current source 2m and a second correcting current source 2n.

In the current adding type digital/analog (D/A) converter 2a, since an output of this D/A converter 2a is obtained as a current value, each potential of the positive-phase output 2c and the negative-phase output 2d may take an arbitrary voltage value.

Using a feedback operation, the first operational amplifier 2e changes the potential of the first output 2f into such a potential which is defined by subtracting a voltage drop appeared across the first resistor 2g from the potential of the positive-phase output 2c. Further, the first operational amplifier 2e changes the potential of the second output 2h into such a potential which is defined by subtracting a voltage drop appeared across the second resistor 2i from the potential of the negative-phase output 2d. Also, an intermediate potential between the first output 2f and the second output 2h is produced by both the third resistor 2j and the fourth resistor 2k, the resistance values of which are equal to each other. This intermediate potential becomes an averaged voltage between the first output 2f and the second output 2h, which is equal to a differential signal. The second operational amplifier 2o controls both the first correcting current source 2m and the second correcting current source 2n in such a manner that both an average voltage of the first output 2f and an average voltage of the second output 2h become equal to the DC reference potential 21.

As previously explained, in the circuit shown in FIG. 2, circuit elements indicated by "2e" to "2o" may function as the level shift circuit with respect to both the positive-phase output 2c and the negative-phase output 2d of the current adding type D/A converter 2a. Also, both the average voltage of the first output 2f and the average voltage of the second output 2h do not depend upon the offset error of the first operational amplifier 2e, but continuously become equal to the DC reference potential 21.

As previously described, if the level shift circuit recited in claim 1 of the present invention is employed, even when the first operational amplifier 2e owns the offset error, then such a level shift circuit having high precision that this offset error does not appear in the first output 2f and the second output 2h can be realized.

Figure 3:
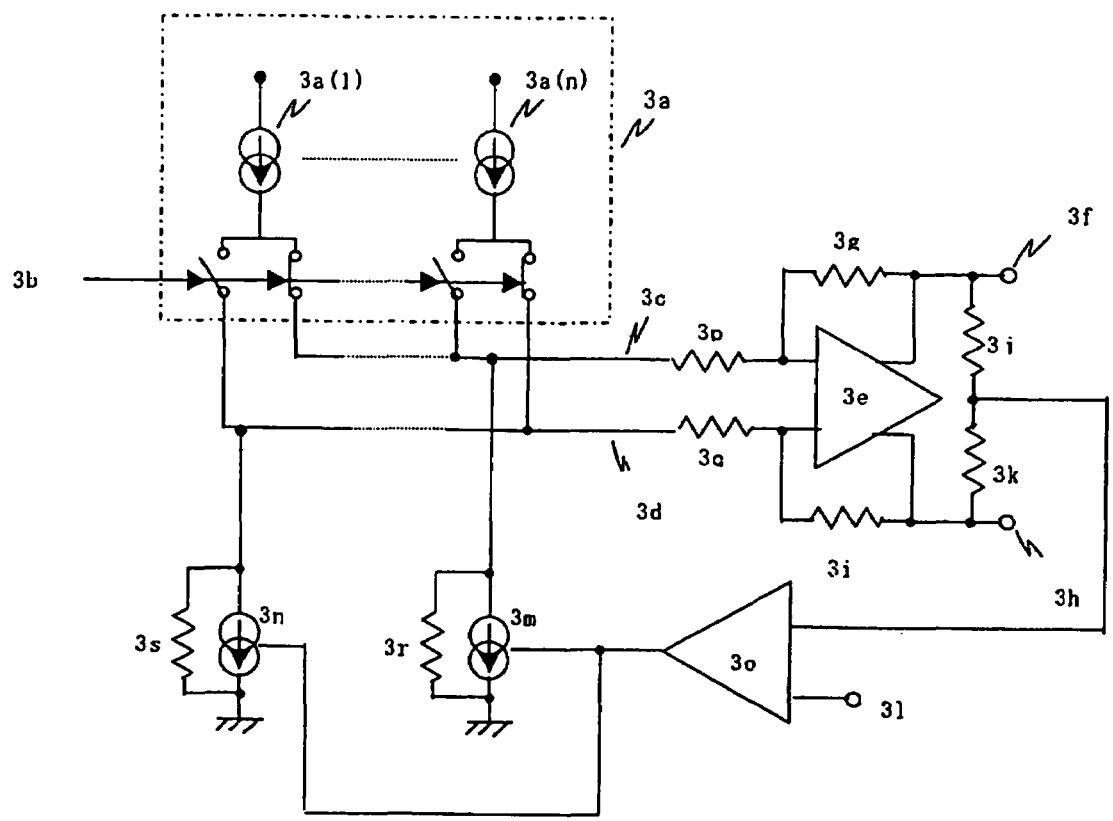
FIG. 3 is an electric wiring diagram for representing a level shift circuit according to an embodiment 2 of the present invention.

FIG. 3 shows an embodiment 2 of a level shift circuit recited in claim 2 of the present invention.

The circuit indicated in FIG. 3 is similar to that of FIG. 2. This circuit owns a different point from that of FIG. 2. That is both a positive-phase output 3c and a negative-phase output 3d of a current adding type digital-to-analog converter 3a are not directly connected to a first operational amplifier 3e having a differential output, but are connected via both a fifth resistor 3p and a sixth resistor 3q to each other. Furthermore, both the positive-phase output 3c and the negative-phase output 3d are connected via both a seventh resistor 3r and an eighth resistor 3s to the ground respectively.

If the circuit arrangement of FIG. 3 is employed, then an arbitrary potential difference can be set between two input voltages of the first operational amplifier 3e, and both the positive-phase output 3c and the negative-phase output 3d of the current adding type digital/analog converter 3a by way of both the fifth resistor 3p and the sixth resistor 3q.

Also, even when the output voltages derived from the first output 3f and the second output 3h are continuously located in such a voltage range which exceeds the output dynamic range of the current adding type digital/analog converter 3a, both the positive-phase output 3c and the negative-phase output 3d are connected through the seventh resistor 3r and the eighth resistor 3s to the ground potential, so that both the output of the positive-phase output 3c and the output of the negative-phase output 3d can be set to such voltages which are present within the voltage range as to the output dynamic range.

Since these effects can be achieved, even in such a case that both the output voltages from the first output 3f and the second output 3h after the level shift operation has been carried out are continuously present within such a voltage range which exceeds the output dynamic range of the current adding type digital/analog-converter 3a, the output voltages can be derived from the first output 3f and the second output 3h without any offset error.

As previously explained, in the circuit shown in FIG. 3, the circuit elements "3e" to "3s" function as the level shift circuit with respect to the positive-phase output 3c and the negative-phase output 3d of the current adding type digital/analog converter 3a. Also, both the average voltage of the first output 3f and the average voltage of the second output 3h continuously become equal to the DC reference potential 31, while not depending upon the output dynamic range of the current adding type digital/analog converter 3a and the offset error of the first operational amplifier 2e.

As previously described, if the level shift circuit recited in claim 2 of the present invention is employed, even when the offset error is contained in the first operational amplifier 3e, this offset error does not appear in the first output 3f and the second output 3h of this first operational amplifier 3e, and further, the high performance level shift circuit having the high precision can be realized, which does not depend upon the output dynamic range of the current adding type digital/analog converter 3a.

Figure 4:
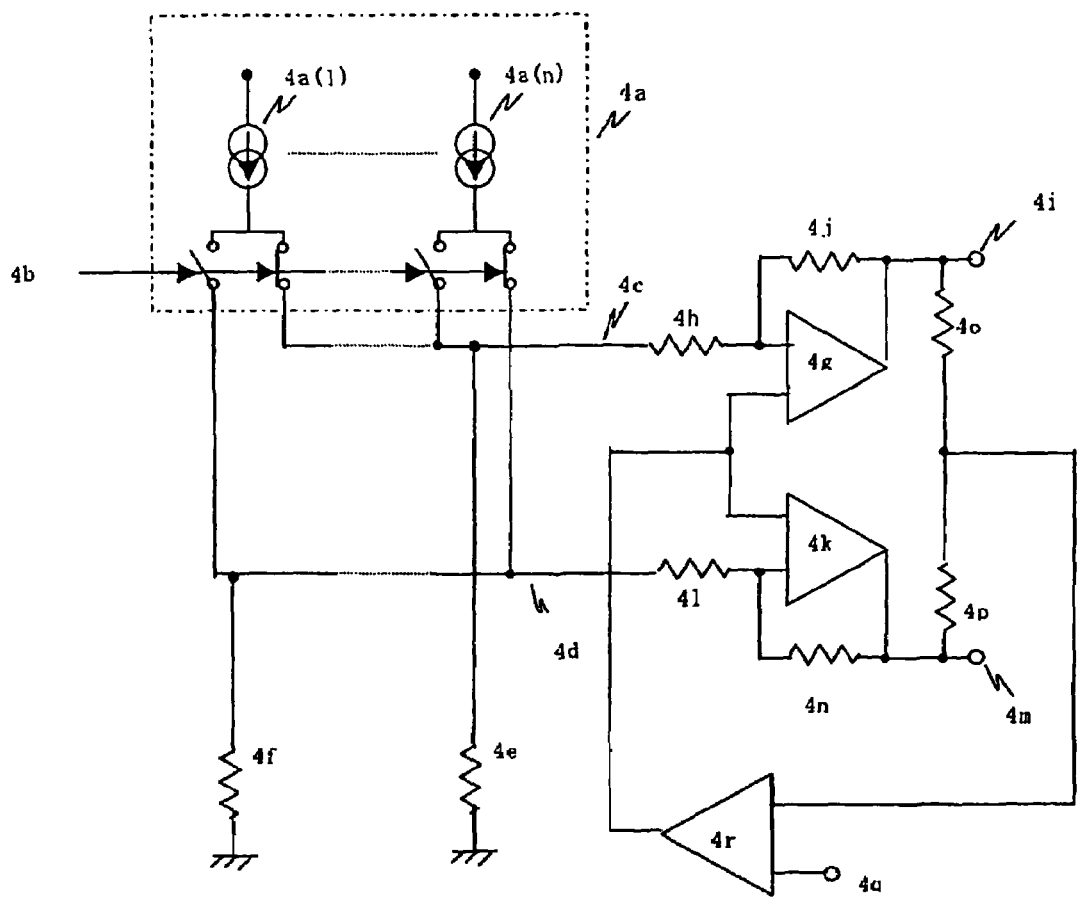
FIG. 4 is an electric wiring diagram for indicating a level shift circuit according to an embodiment 3 of the present invention.

FIG. 4 indicates an embodiment 3 of a level shift circuit recited in claim 3 of the present invention.

The circuit represented in FIG. 4 is provided with a current adding type digital-to-analog converter 4a, a first resistor 4e, a second resistor 4f, a first operational amplifier 4g, a third resistor 4h, a fourth resistor 4j, a second operational amplifier 4k, a fifth resistor 4l, a sixth resistor 4n, a seventh resistor 4o, an eighth resistor 4p, and also, a third operational amplifier 4r. The current adding type digital/analog converter 4a is constituted by "n" pieces of current sources 4a(1) to 4a(n) which have been weighted respectively every bit, and plurality of switches, any one of which is turned ON by an "n"-bit digital input value 4b, and owns both a positive-phase output 4c and a negative-phase output 4d. The first resistor 4e is connected between the positive-phase output 4c and the ground potential. The second resistor 4f is connected between the negative-phase output 4d and the ground potential. The third resistor 4h is connected between the positive-phase output 4c and an inverting input terminal of the first operational amplifier 4g. The fourth resistor 4j is connected between a first output terminal 4i and the inverting input terminal of the first operational amplifier 4g. The sixth resistor 4n is connected between a second output terminal 4m and an inverting input terminal of the second operational amplifier 4k. The seventh resistor 4o and the eighth resistor 4p have the same resistance values with each other, and are series-connected between the first output terminal 4i and the second output terminal 4m. In the third operational amplifier 4r, a DC reference potential 4q is connected to a positive-phase input terminal thereof; a connection point between the seventh resistor 4o and the eighth resistor 4p is connected to an inverting input terminal thereof; and also, an output thereof is commonly connected to both a positive-phase input terminal of the first operational amplifier 4g and a positive-phase input terminal of the second operational amplifier 4k.

The current adding type digital/analog converter 4a outputs a differential voltage signal from the positive-phase output 4c and the negative-phase output 4d by the first resistor 4e and the second resistor 4f. Also, the first operational amplifier 4g, the third resistor 4h, and the fourth resistor 4j constitute a first inverting amplifier circuit, whereas, the second operational amplifier 4j, the fifth resistor 4l, and the sixth resistor 4m constitute a second inverting amplifying circuit. Both the first inverting amplifying circuit and the second inverting amplifying circuit perform inverting amplifying operations, while an output voltage of the third operational amplifier 4r is used as a common reference voltage.

In this circuit, the output voltage of the third operational amplifier 4r constitutes an intermediate potential between the first output terminal 4i corresponding to an output of the first inverting amplifying circuit, and the second output terminal 4m corresponding to an output of the second inverting amplifying circuit, namely, such a voltage which is obtained by amplifying a difference between an average voltage of each of the differential output signals and the DC reference potential 4q. The output of this third operational amplifier 4r, the first inverting amplifying circuit, and the second inverting amplifying circuit constitute a feedback loop. This feedback loop increases and decreases each of the output voltages from the first output terminal 4i, and each of the output voltages from the second output terminal 4m along the same direction. As a result, this feedback loop may perform a feedback operation in such a manner that a voltage at a center point between the first output terminal 4i and the second output terminal 4m, namely, the average voltage of each of the differential output signals may become equal to the DC reference potential 4q.

As previously explained, in the circuit shown in FIG. 4, the circuit elements "4e" to "4r" function as the level shift circuit with respect to the positive-phase output 4c and the negative-phase output 4d of the current adding type digital/analog converter 4a. Also, both the average voltage of the first output 4i and the average voltage of the second output 4m continuously become equal to the DC reference potential 4q, while not depending upon the output dynamic range of the current adding type digital/analog converter 4a, and the offset error of the first operational amplifier 4q, and also the offset error of the second operational amplifier 4k.

As previously described, if the level shift circuit recited in claim 3 of the present invention is employed, even when the offset errors are contained in the first operational amplifier 4q and the second operational amplifier 4k, these offset errors do not appear in the first output 4i and the second output 4m of the first operational amplifier 4q and the second operational amplifier 4k, and further, the high performance level shift circuit having the high precision can be realized, which does not depend upon the output dynamic range of the current adding type digital/analog converter 4a.

Figure 5:
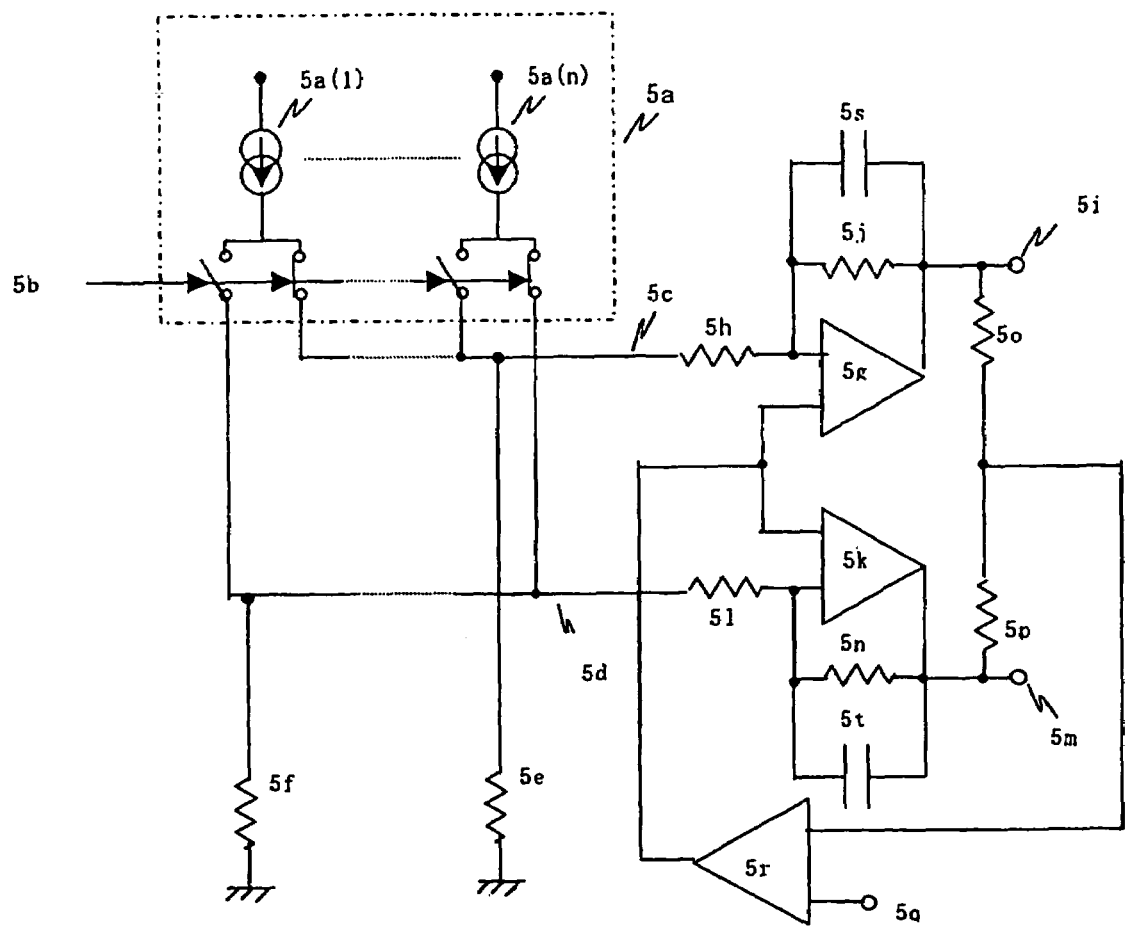
FIG. 5 is an electric wiring diagram for representing a level shift circuit-according to an embodiment 4 of the present invention.

FIG. 5 shows an embodiment 4 of a level shift circuit recited in claim 2 of the present invention.

The circuit indicated in FIG. 5 is similar to that of FIG. 4. This circuit owns a different point from that of FIG. 4. That is, a first capacitor 5s is connected parallel to a fourth resistor 5j, and a second capacitor 5t is connected parallel to a sixth resistor 5n.

Within the circuit of FIG. 5, a first operational amplifier 5g, a third resistor 5h, and a fourth resistor 5j constitute a first inverting amplifying circuit, whereas a second operational amplifier 5j, a fifth resistor 5l, and a sixth resistor 5m constitute a second inverting amplifying circuit. As a consequence, filter functions can be additionally provided with respect to the portions of the first inverting amplifying circuit and the second inverting amplifying circuit by adding the capacitors. In the case of this embodiment, since the first capacitor 5s and the second capacitor 5t are additionally employed, both the first inverting amplifying circuit and the second inverting amplifying-circuit can own such a function of a primary active LPF (low-pass filter). Also, since such a filter function can be easily added, it is readily predictable that a complex filter circuit may be arranged by furthermore combining a high-order LPF with an HPF (high-pass filter).

As previously described, if the level shift circuit recited in claim 4 of the present invention is employed, even when the offset errors are contained in the first operational amplifier 5g and the second operational amplifier 5k, these offset errors do not appear in the first output 5i and the second output 5m of the first operational amplifier 5g and the second operational amplifier 5k, and further, the high performance level shift circuit having the high precision can be realized in addition to the filter function, which does not depend upon the output dynamic range of the current adding type digital/analog converter 5a.

[Effect of the Invention]

In accordance with the present invention, since the two resistors having the same resistance values to each other and the operational amplifier are provided in order to perform the common mode potential feedback in addition to the operational amplifier for outputting the differential signal, such a level shift circuit which can self-correct even such an offset error owned by the operational amplifier itself used to output the differential signal can be realized by the small-scaled circuit arrangement. Moreover, if the level shift circuit of the present invention is employed, then this level shift circuit-can be easily manufactured in high performance by adding the filter function, or the like, so that the small-scaled and high performance analog interface circuit can be readily realized in high precision.

What is claimed is:

1. A level shift circuit having a level shift function, in which since the level shift circuit is connected to a current adding type digital/analog converter constituted by a plurality of constant current sources which have been weighted by bits and having two differential outputs such as a positive-phase output terminal and a negative-phase output terminal, an arbitrary voltage is added to an analog output voltage of the current adding type digital/analog converter so as to be outputted, the level shift circuit comprising:
   a first operational amplifier;
   a second operational amplifier;
   a first resistor, connected between the positive-phase output terminal of the current adding type digital/analog converter and an inverting input terminal of said first operational amplifier;
   a second resistor, connected between the inverting input terminal of the first operational amplifier and a positive-phase output terminal thereof;
   a third resistor, connected between the negative-phase output terminal of the current adding type digital/analog converter and a positive-phase input terminal of the first operational amplifier;
   a fourth resistor, connected between the positive-phase input terminal of the first operational amplifier and an inverting output terminal thereof;
   a fifth resistor, connected between the positive-phase output terminal of the first operational amplifier and the positive-phase input terminal of the second operational amplifier;
   a sixth resistor, having the same resistance value as that of the fifth resistor, and connected between the inverting output terminal of the first operational amplifier and the positive-phase input terminal of said second operational amplifier;
   a first voltage-controlled current source connected to the positive-phase output terminal of the current adding type digital/analog converter; and
   a second voltage-controlled current source connected to the negative-phase output terminal of the current adding type digital/analog converter;
   wherein the inverting input terminal of the second operational amplifier is connected to a third input terminal; and an output of the second operational amplifier is connected to both the first voltage-controlled current source and the second voltage-controlled current source.

2. A level circuit having a shift function, in which since the level circuit is connected to a current adding type digital/analog converter constituted by a plurality of constant current sources which have been weighted by bits and having two differential outputs such as a positive-phase output terminal and a negative-phase output terminal, an arbitrary voltage is added to an analog output voltage of said current adding type digital/analog converter so as to be outputted, the level shift circuit comprising:
   a first operational amplifier;
   a second operational amplifier;
   a first resistor, connected between the positive-phase output terminal of the current adding type digital/analog converter and an inverting input terminal of the first operational amplifier;
   a second resistor, connected between the inverting input terminal of the first operational amplifier and a positive-phase output terminal thereof;
   a third resistor, connected between the negative-phase output terminal of the current adding type digital/analog converter and a positive-phase input terminal of the first operational amplifier;
   a fourth resistor, connected between the positive-phase input terminal of the first operational amplifier and an inverting output terminal thereof;
   a fifth resistor, connected between the positive-phase output terminal of the first operational amplifier and the positive-phase input terminal of the second operational amplifier;
   a sixth resistor, having the same resistance value as that of the fifth resistor, and connected between the inverting output terminal of said first operational amplifier and the positive-phase input terminal of the second operational amplifier;
   a first voltage-controlled current source, connected to the positive-phase output terminal of the current adding type digital/analog converter; and
   a second voltage-controlled current source, connected to the negative-phase output terminal of the current adding type digital/analog converter;
   wherein the inverting input terminal of the second operational amplifier is connected to a third input terminal;
   and an output of the second operational amplifier is connected to both the first voltage-controlled current source and the second voltage-controlled current source.

3. A level circuit having a level shift function, in which since the level circuit is connected to a current adding type digital/analog converter constituted by a plurality of constant current sources which have been weighted by bits and having two differential outputs such as a positive-phase output terminal and a negative-phase output terminal, an arbitrary voltage is added to an analog output voltage of said current adding type digital/analog converter so as to be outputted, the level shift circuit comprising:
   a first operational amplifier;
   a second operational amplifier;
   a third operational amplifier;
   a first resistor, connected between the positive-phase output terminal of the current adding type digital/analog converter and an inverting input terminal of the first operational amplifier;
   a second resistor, connected between the inverting input terminal of the first operational amplifier and a first output terminal thereof;

a third resistor, connected between the negative-phase output terminal of the current adding type digital/analog converter and a an inverting input terminal of the second operational amplifier;

a fourth resistor, connected between the inverting input terminal of the second operational amplifier and a second output terminal;

a fifth resistor, connected between the inverting input terminal of the third operational amplifier and the first output terminal; and a sixth resistor having the same resistance value as that of said fifth resistor, and connected between the inverting input terminal of the third operational amplifier and the second output terminal;

wherein the positive-phase input terminal of the third operational amplifier is connected to a third input terminal;

and an output of said third operational amplifier is connected to both the positive-phase input terminal of the first operational amplifier and the positive-phase input terminal of the second operational amplifier.

4. The level shift circuit as claimed in claim 2, or claim 3 wherein a first capacitor is connected parallel to the second resistor; and a second capacitor is connected parallel the fourth resistor.

* * * * *